(12) United States Patent
Heinze et al.

(10) Patent No.: US 7,961,066 B2
(45) Date of Patent: Jun. 14, 2011

(54) BULK ACOUSTIC WAVE RESONATOR FILTER

(75) Inventors: Habbo Heinze, Weil im Schönbuch (DE); Pasi Tikka, Unterhaching (DE); Edgar Schmidhammer, Stein (DE)

(73) Assignee: EPCOS AG, Munich (DE)

( * ) Notice: Subject to any disclaimer, the term of this patent is extended or adjusted under 35 U.S.C. 154(b) by 225 days.

(21) Appl. No.: 12/095,085

(22) PCT Filed: Dec. 4, 2006

(86) PCT No.: PCT/DE2006/002165
§ 371 (c)(1),
(2), (4) Date: Sep. 30, 2008

(87) PCT Pub. No.: WO2007/062647
PCT Pub. Date: Jun. 7, 2007

(65) Prior Publication Data
US 2009/0079521 A1    Mar. 26, 2009

(30) Foreign Application Priority Data

Dec. 2, 2005 (DE) .......................... 10 2005 057 762

(51) Int. Cl.
*H03H 9/54* (2006.01)
(52) U.S. Cl. .................... 333/189; 333/190; 310/322
(58) Field of Classification Search .......... 333/187–192; 310/322, 335
See application file for complete search history.

(56) References Cited

U.S. PATENT DOCUMENTS

| 6,262,637 | B1 | 7/2001 | Bradley et al. |
| 6,518,860 | B2 * | 2/2003 | Ella et al. ..................... 333/189 |
| 6,587,212 | B1 | 7/2003 | Barber et al. |
| 6,788,170 | B1 * | 9/2004 | Kaitila et al. ................ 333/187 |
| 6,933,807 | B2 * | 8/2005 | Marksteiner et al. ........ 333/187 |
| 2004/0140869 | A1 | 7/2004 | Marksteiner et al. |

FOREIGN PATENT DOCUMENTS

| DE | 102 41 425 | 3/2004 |
| EP | 1 221 770 | 7/2002 |
| WO | WO01/06646 | 1/2001 |
| WO | WO01/06647 | 1/2001 |

OTHER PUBLICATIONS

Ruby et al.; "Acoustic FBAR for Filters, Duplexers and Front End Modules"; 2004 IEEE MTT-S International Microwave Symposium Digest, vol. 2, pp. 931-934, Jun. 6-11, 2004.*
Reinhardt et al.; "Investigation of Spurious Resonances in Thin Film Bulk Acoustic Wave Resonators"; 2004 IEEE International Ultrasonics, Ferroelectrics, and Frequency Control Joint 50th Anniversary Conference, vol. 3, pp. 1698-1701, Aug. 23-27, 2004.*

(Continued)

*Primary Examiner* — Barbara Summons
(74) *Attorney, Agent, or Firm* — Fish & Richardson P.C.

(57) ABSTRACT

The invention relates to a filter operating with bulk acoustic waves, comprising at least one first resonator and at least one second resonator. In the at least one first and second resonator, a longitudinal acoustic mode is capable of propagation, for which normal dispersion is adjusted in the first resonator and abnormal dispersion in the second resonator by selection of the material and the relative layer thicknesses. In particular, the power compatibility of the filter at the higher frequency edge of its passband can be improved.

13 Claims, 6 Drawing Sheets

OTHER PUBLICATIONS

Pensala et al.; "Laser Interferometric Measurement of Lamb Wave Dispersion and Extraction of Material Parameters in FBARs"; 2002 IEEE Ultrasonics Symposium Proceedings, vol. 1, pp. 977-980, Oct. 8-11,2002.*

Fattinger et al.; "Laser Measurements and Simulations of FBAR Dispersion Relation"; 2001 IEEE MTT-S Microwave Symposium Digest, vol. 1, pp. 371-374, May 20-25, 2001.*

Schmidhammer et al "Design Flow and Methodology on the Design of BAW Components", IEEE Microwave Symposium, Jun. 12-17, 2005 pp. 233-236 XP010844730, ISBN 0780388461.

Lowe "Matrix Techniques for Modeling Ultrasonic Waves in Multilayered media"IEEE transaction on Ultrasonics, Jul. 1995, vol. 42, No. 4, pp. 525-542.

International Search Report for PCT/DE2006/002165 mailed May 2007.

Written Opinion for PCT/DE2006/002165 based on search report mailed May 2007.

English translation of Written Opinion for PCT/DE2006/002165 based on search report mailed May 2007.

* cited by examiner

BULK ACOUSTIC WAVE RESONATOR FILTER

CROSS REFERENCE TO RELATED APPLICATIONS

Pursuant to 35 USC §120, this application claims the benefit of PCT/DE2006/002165 filed Dec. 4, 2006 which claims the benefit of German Patent Application No. 102005057762.8 filed Dec. 2, 2005. Each of these applications is incorporated by reference in its entirety.

TECHNICAL FIELD

The invention pertains to a resonator operating with bulk acoustic waves (BAW resonator). BAW resonators are used in high-frequency bandpass filters, for instance.

BACKGROUND

A resonator operating with bulk acoustic waves, also referred to as a thin-film resonator or FBAR (FBAR=thin-film BAW resonator) has a piezoelectric layer that is arranged between two electrode layers. Thin-film resonators of the diaphragm type that are arranged over a cavity formed in a carrier substrate are known from the publication U.S. Pat. No. 6,262,637 B1. Furthermore, thin-film resonators that are arranged on an acoustic mirror are known, for example, from the publications WO 01/06646, US 2004/0140869 and DE 10241425 A1. Layers are deposited in succession on a substrate and are structured into resonators which are interconnected electrically, and together realize a filter circuit, for example.

In case a filter comprising a thin-film resonator heats up, its characteristic curve migrates in certain situations to lower frequencies. The insertion loss at the right edge of the passband also increases, which results in an even greater heating of the resonators in this frequency range. When the limit of the power compatibility is exceeded, the acoustic component is destroyed.

SUMMARY

One problem to be solved is to specify a filter operating with bulk acoustic waves in which this problem is eliminated.

It was recognized that a part of the self-heating of BAW resonators can be traced back to the amplified acoustic oscillations at the corresponding frequency. The invention is based on the idea of improving the power compatibility of a BAW filter in a given frequency range, particularly at the higher frequency edge of its passband.

A filter is specified that comprises at least one first resonator operating with bulk acoustic waves and at least one second resonator operating with bulk acoustic waves. A longitudinal acoustic mode (principal mode) is capable of propagation in the resonators. Normal dispersion behavior for this mode is adjusted in the first resonator, and abnormal dispersion behavior in the second resonator. The adjustment of the dispersion behavior is possible by the selection of the materials and the relative layer thicknesses.

The type of dispersion behavior can be adjusted by the selection of the layer sequence, the material and the layer thicknesses of a resonator stack.

The first resonator is preferably a parallel resonator connected in a shunt arm, and the second resonator is preferably a series resonator connected in series in a signal path. A ladder-type arrangement, in which all series resonators are second resonators and all parallel resonators are first resonators, is advantageous.

It was found that a resonator in which abnormal dispersion behavior is adjusted has relatively small acoustic oscillations above its resonant frequency, compared to a resonator with normal dispersion. By using such resonators it is possible in particular to reduce the self heating of the resonators at the frequencies which lie in the area of the higher edge of the filter's passband. The specified filter is characterized in that the acoustic excitation in the critical range of its transmission function is deliberately attenuated by using second resonators.

The resonator surface area, or the volume region of the resonator lying between the electrodes, is also called the active region. A direction parallel to the layer surfaces is referred to below as the lateral direction while the direction perpendicular to it is referred to as the vertical or longitudinal direction (z-axis).

The thickness of the piezoelectric layer determines the resonant frequency $f_r$ of the principal acoustic mode, which is the first harmonic of the (vertical) longitudinal bulk acoustic wave. The thickness of the additional layers of the resonator stack also has an influence on the resonant frequency of the resonator.

The bulk acoustic wave is a three-dimensional wave that is characterized by a wave vector with three components ($k_x$, $k_y$, $k_z$), which are called wave numbers. The lateral acoustic modes are characterized by the lateral wave numbers $k_x$, $k_y$. The longitudinal acoustic mode is characterized by the (vertical or longitudinal) wave number $k_z$. The wave number specifies the number of wavelengths per length unit in the corresponding direction. In the ideal case of an infinitely elongated resonator, longitudinal acoustic waves are mainly excited by the electric field along the field direction (z-axis), where $k_z \neq 0$.

The wave number of an acoustic mode results from the solution of a wave equation with freely determined boundary conditions. The wave number can be real, purely imaginary or complex. The acoustic modes with an imaginary wavelength decay exponentially and are therefore not capable of oscillation. For this reason it is only possible to excite modes with a real wave number in the resonator.

Dispersion diagrams are used to describe the modes capable of propagation in an acoustic thin-film resonator. An acoustic system, such as a freely oscillating plate infinitely extended in the lateral plane, can be described by natural frequencies of the modes, which are plotted as the ordinate in a 2-D cartesian coordinate system. The imaginary components of lateral wave number components are plotted along the abscissa to the left of the ordinate zero, and the real components of the same lateral wave number components are plotted for values to the right. For reasons of symmetry, it is sufficient for a description of the overall system to use only one of the two lateral components $k_x$, $k_y$. Therefore $k_x$ will be used below without loss of generality.

The type of wave relevant to the operation of an acoustic thin-film resonator is a longitudinal wave oscillating in the thickness direction of the resonator with vanishing lateral wave number $k_x$, $k_y = 0$ (fundamental mode). For this wave type, however, there can also be modes with a nonzero lateral wave number, alongside the useful fundamental mode. The principal mechanical resonance results at a limit frequency (cutoff frequency in English) $f_{cL}$ ($k_x = 0$). If longitudinal modes with a wave number not equal to zero in a resonator have a natural frequency that is higher than this cutoff frequency, the behavior of the longitudinal wave is referred to as normal dispersion. In case the natural frequencies of such longitudinal modes are less than $f_{cL}$ ($k_x=0$), its behavior is referred to as abnormal dispersion.

In addition, a shear wave can be propagated in a resonator. The resonant frequency of the shear wave lies at a markedly lower frequency than the resonant frequency $f_{cL}$ of the longitudinal mode. However, the resonant frequency $f_{cS}$ ($k_x=0$) of a higher harmonic of the shear wave (e.g., the first or second one) can lie in the vicinity of $f_{cL}$.

The dispersion behavior of the longitudinal wave of a freely oscillating plate that is infinitely elongated in a lateral plane is mainly determined by the elastic properties of this plate.

The shear wave is always slower than the longitudinal wave. The dispersion behavior of the resonator is determined by the ratio of the speed $v_S$ of the shear wave to the speed $v_L$ of the longitudinal wave (in the piezoelectric layer in which the wave propagates). For normal dispersion, $v_S/v_L<0.5$, and for abnormal dispersion, $v_S/v_L>0.5$. This applies for instance to thin-film resonators of the diaphragm type.

In a system of several stacked layers the dispersion behavior of the longitudinal wave is determined not only by the elastic properties but also by the relative layer thicknesses. In addition to the piezoelectric layer, the mirror layers in a thin-film resonator with an acoustic mirror, particularly the layers closest to the resonator region, have a great influence on the dispersion behavior of the resonator's overall layer structure. But even for such complexly constructed systems, the ratio $v_S/v_L$ serves as a criterion for the dispersion behavior of the resonator.

The electrical characteristics of the filter are described by its transmission function (or scattering parameters $S_{21}$). The transmission function of a known filter in a ladder-type structure is shown in FIG. 1A. The transmission characteristics of a resonator are determined by its admittance curve $Y_{11}$. The admittance curve of the associated series resonator is shown in FIG. 1B. $f_{r,s}$ is the resonant frequency and $f_{a,s}$ is the antiresonant frequency of the series resonator. The resonant frequency $f_{r,s}$ lies in the middle of the passband, and the antiresonant frequency $f_{a,s}$ lies at its right edge. The resonant frequency of the associated parallel resonator determines the left edge of the passband. The antiresonant frequency of the parallel resonator largely agrees with $f_{r,s}$.

It was found—see the publication U.S. Pat. No. 6,587,212 B1 for instance—that in the frequency range which corresponds to the edges of the transmission function, a high energy absorption occurs as a result of a high acoustic activity in the resonator, which leads in a duplexer filter with a high operating power level of 30 dBm, for example, to heating of the resonators up to approximately 200° C., to mechanical damage and therefore to a short service life of the resonators.

In known filters based on BAW resonators, the frequency range that corresponds to the right edge of the filter's passband, i.e., the range above the resonant frequency of the series resonator for a filter in a ladder-type structure, is particularly affected in this regard. The critical frequency range is circled in FIGS. 1A, 1B. A frequency from the critical frequency range that corresponds to the center of this range is labeled $f_c$.

The inventors recognized that such problems appear especially for resonators with normal dispersion behavior $f(k_x)$ of the acoustic mode.

The propagation velocity, and therefore the dispersion behavior of the acoustic mode, in a layer system is dependent on the layer structure, in particular, the composition of the individual layers and their relative thicknesses. Therefore the layer system of the second resonator is constructed such that it has abnormal dispersion of the acoustic longitudinal wave with wave number $k_x$.

A dispersion curve s of a series resonator and a dispersion curve p of a parallel resonator are shown in FIG. 3, wherein both resonators have normal dispersion of the acoustic mode (longitudinal wave). $f_{r,s}$ is the resonant frequency of the series resonator, and $f_{r,p}$ is the resonant frequency of the parallel resonator.

The resonant frequency of the resonator is usually the frequency at which the behavior of the dispersion curve $f(k_x)$ changes from imaginary numbers $\text{Im}\{k_x\}$ to real numbers $\text{Re}\{k_x\}$.

For normal dispersion, the wave number $k_x$ for frequencies above the resonant frequency, in particular for a frequency $f_c>f_{r,s}$ corresponding to the right edge of the passband, is real, i.e., the longitudinal wave is capable of propagation in the series resonator. For frequencies below $f_{r,s}$ on the other hand, $k_x$ is imaginary, and the longitudinal wave is attenuated in the series resonator.

A resonator with normal dispersion accordingly has large-amplitude acoustic oscillations above the resonant frequency $f_r$, see FIG. 1C. Especially at the critical frequency $f_c$, which corresponds to the right edge of the transmission function, the intensity of the acoustic oscillations is very high.

Resonators with normal dispersion behavior of the longitudinal principal mode have the advantage that they are particularly suited for eliminating acoustic losses. With such resonators, it is possible, for instance, to modify their edge areas such that the propagation of an undesired lateral acoustic mode with $k_x$ not equal to zero is suppressed. For example, it is possible to arrange a frame on a resonator stack above the region provided as the edge area of the resonator, which surrounds the acoustically active region of a resonator on all sides. The frame is constructed and positioned such that the acoustic wave in the edge area of the resonator has a substantially purely real wave number $k_x$, with $k_x=0$ being achieved in the active region of this resonator, and with a substantially purely imaginary wave number $k_x$ being achieved outside the active region and the edge area.

In an advantageous variant, the first and second resonator each has a resonator stack with a resonator region and an acoustic mirror.

An isolated resonator region is understood to mean a resonator region which has boundaries with the air at the top and the bottom. In one embodiment, the acoustic mirror is formed in at least one first or second resonator such that the dispersion behavior of the entire resonator stack differs from the dispersion behavior of the isolated resonator region of this resonator.

A resonator stack of the second resonator is constructed such that the longitudinal wave is not capable of oscillating at a frequency $f_c$ that lies above the resonant frequency $f_r$ of the resonator stack. The lateral wave number $k_x$ here is purely imaginary at this frequency, which corresponds to abnormal dispersion behavior of the acoustic mode. The resonator with abnormal dispersion heats up considerably less than the resonator with normal dispersion at the same operating power. Therefore the electrical properties of the resonator with abnormal dispersion remain stable during operation, and it has a higher power compatibility.

The first or second resonator has two electrode layers and a piezoelectric layer arranged between them. The acoustic mirror has alternately arranged layers with a low and a high acoustic impedance, the thickness of which is preferably one quarter wavelength (at the resonant frequency of the resonator stack).

Undesired acoustic oscillations with abnormal dispersion behavior of the acoustic mode that lead to heating of the resonator are attenuated in the resonator stack. In particular, the power compatibility of the filter can thus be improved at the higher frequency edge of its passband. The specified filter can be used particularly in duplexer filters subject to a high power.

The resonator stack is characterized by its resonant frequency $f_r$ and its antiresonant frequency $f_a$. In the second resonator, the following is true: the lateral wave number $k_x$ of the longitudinal mode is imaginary in the frequency range above the resonant frequency, in particular, between the resonant frequency and the antiresonant frequency.

The ratio of the velocity $v_S$ of the shear wave to the velocity $v_L$ of the longitudinal wave in the piezoelectric layer is adjusted by the selection of the material and the relative thicknesses of the layers of the resonator stack in the second resonator such that $v_S/v_L > 0.5$.

The electrode layers can consist of Al, AlCu, Mo, W or Pt. The electrode layers can also have several sublayers and can comprise, for instance, at least one sublayer of Al, AlCu, Mo, W or Pt.

The resonator stack of the second and possibly also the first resonator can have at least one adapting layer—electrically insulating in one variant—that forms a composite together with the lower or upper electrode layer. The adapting layer is preferably arranged on the upper electrode layer. The adapting layer can consist of $SiO_2$, SiN or Al, or have at least one such sublayer.

In one advantageous variant, the second resonators of the filter are furnished with an adapting layer, while the first resonators of this filter do not have such a layer. It is also possible, however, for both the first and the second resonators to have an adapting layer, it being advantageous if the thicknesses of the adapting layer for the first and second resonators differ from one another. The adapting layer is also suitable as a passivation layer made of an electrically insulating, preferably dielectric material, for the upper electrode layer of the resonator, for example.

The piezoelectric layer can consist of several piezoelectric sublayers, at least one of which can be an AlN layer.

In a preferred variant, the material of the piezoelectric layer is a material, e.g., AlN that has abnormal dispersion of the acoustic mode. For electrode layers of Mo or for sufficiently thin electrode layers of Al, W for example, the dispersion of the overall structure is still abnormal.

Beyond a certain thickness of the electrode layers, the dispersion behavior is converted into normal dispersion. It is therefore possible in a filter with series and parallel resonators to construct the series resonators, for example, as layer structures with abnormal dispersion behavior, and the parallel resonators as layer structures with an additional adapting layer of aluminum, for example, and normal dispersion behavior. In this case, the adapting layer (for the parallel resonators) assures the conversion of abnormal dispersion to normal dispersion. The longitudinal wave is indeed capable of oscillating at the critical frequency $f_c$ in the parallel resonator. But in this case, the parallel resonator oscillates far away from its resonant frequency and therefore the amplitudes of the oscillations are small.

The invention will be described below in detail on the basis of embodiments and the associated figures. The figures show various embodiments of the invention on the basis of schematic representations not true to scale. Identical or identically functioning parts are labeled with identical reference numbers.

DETAILED DESCRIPTION

Figure 2A:
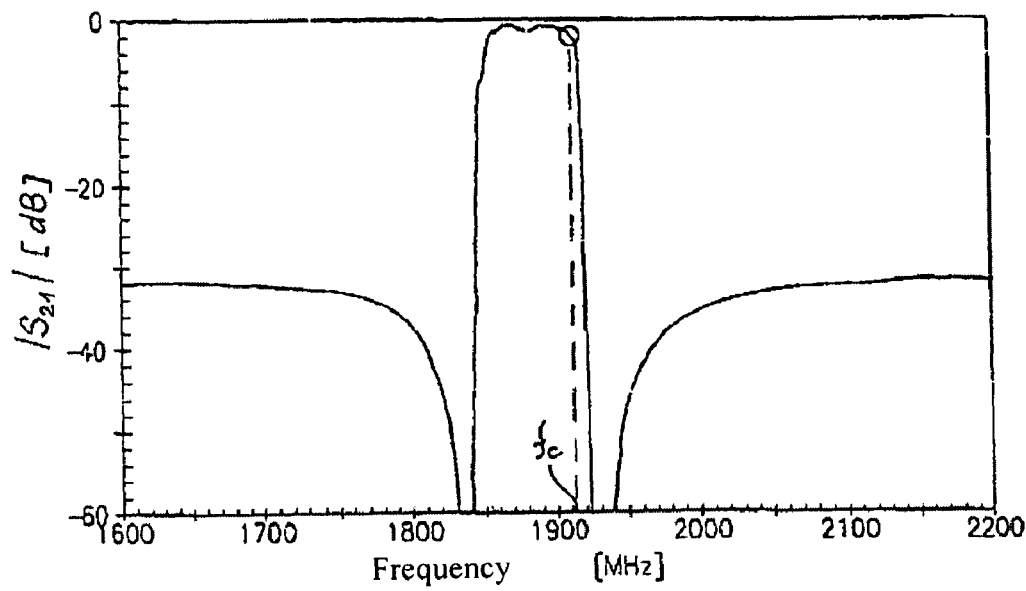
FIG. 2A, the transmission function of a filter with first resonators used as parallel resonators and second resonators used as series resonators.
Figure 2B:
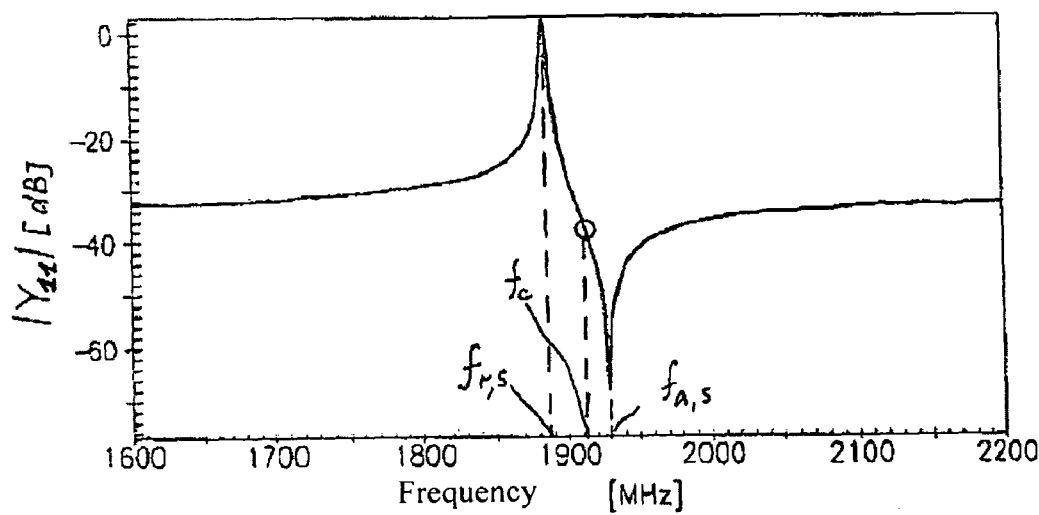
FIG. 2B, the admittance curve of a series resonator of the filter with first resonators used as parallel resonators, and second resonators used as series resonators.

FIG. 2A shows the transmission function of a reactance filter according to the invention. FIG. 2B shows the admittance curve of the associated series resonator. The frequency range at the right edge of the passband, which is critical with respect to power compatibility, is marked with a circle. The frequency $f_c$ between the resonant frequency $f_{r,s}$ and the antiresonant frequency $f_{a,s}$ of the series resonator corresponds to the right edge of the passband.

Figures 1A, 1B, 1C:
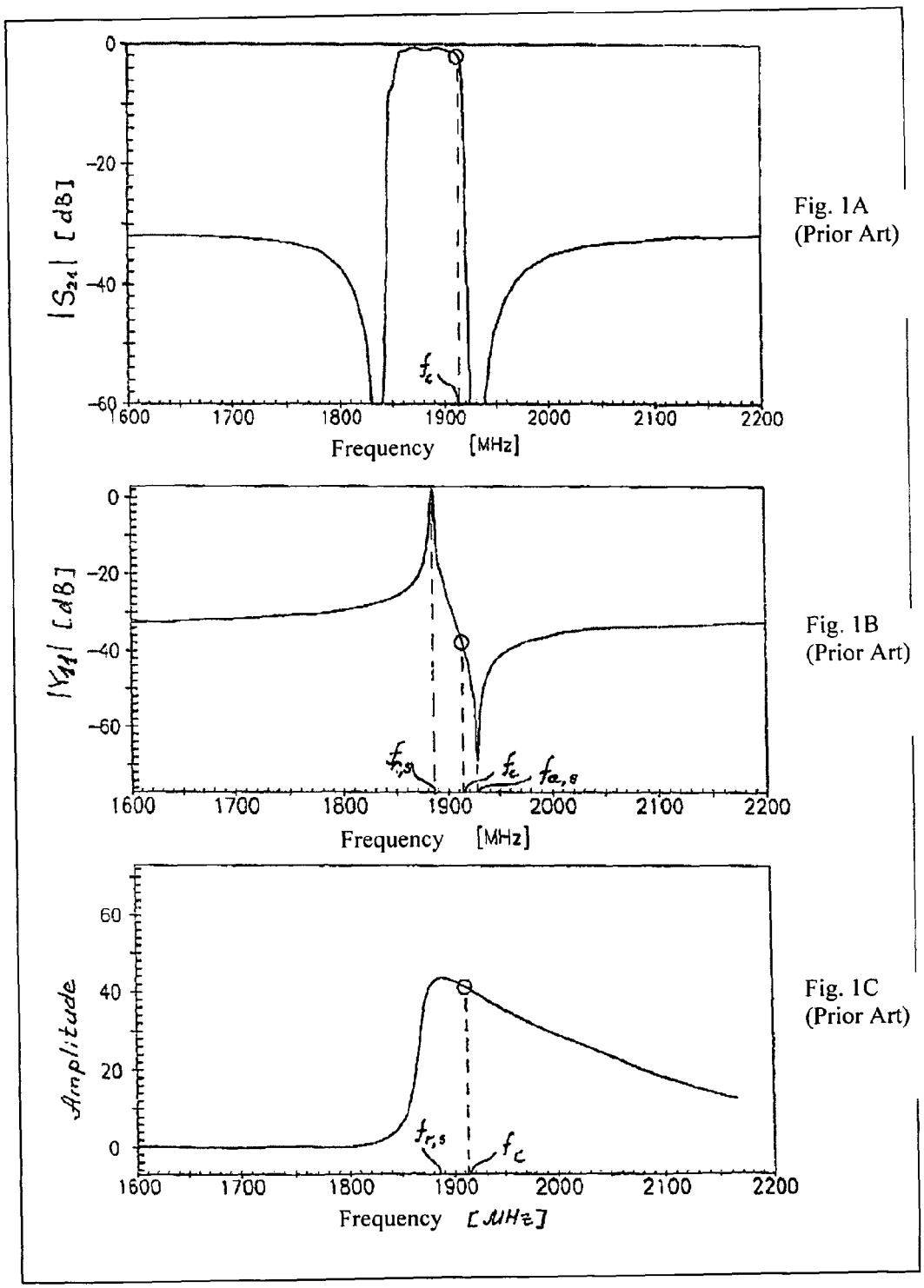
FIG. 1A schematically shows the transmission function of a known reactance filter.
FIG. 1B, the admittance curve of a series resonator in a known reactance filter.
FIG. 1C, the frequency dependence of the amplitude of the acoustic oscillations in the series resonator in a known filter.
Figure 2C:
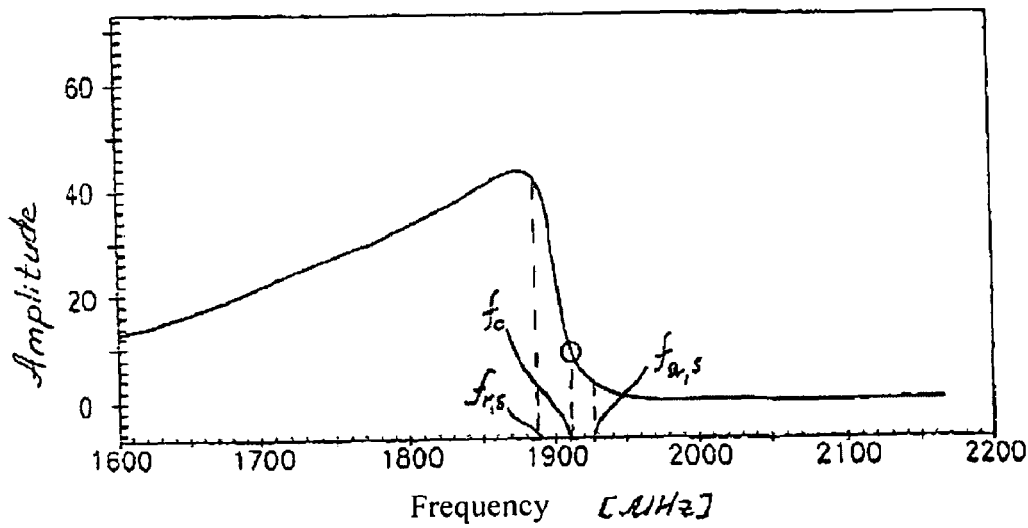
FIG. 2C, the frequency dependence of the amplitude of the acoustic oscillations in a series resonator (in the filter with first resonators used as parallel resonators and second resonators used as series resonators)

The frequency dependence of the intensity of the acoustic waves, which can be recorded by means of a laser interferometer, for instance, is shown in FIG. 2C. The amplitude of the acoustic oscillations in a series resonator at the critical frequency $f_c$ with $f_{r,s} < f_c < f_{a,s}$ is low, i.e., the acoustic oscillations at this frequency are substantially attenuated. The amplitude of the acoustic oscillations in FIGS. 1C, 2C is indicated in arbitrary units.

Figure 3:
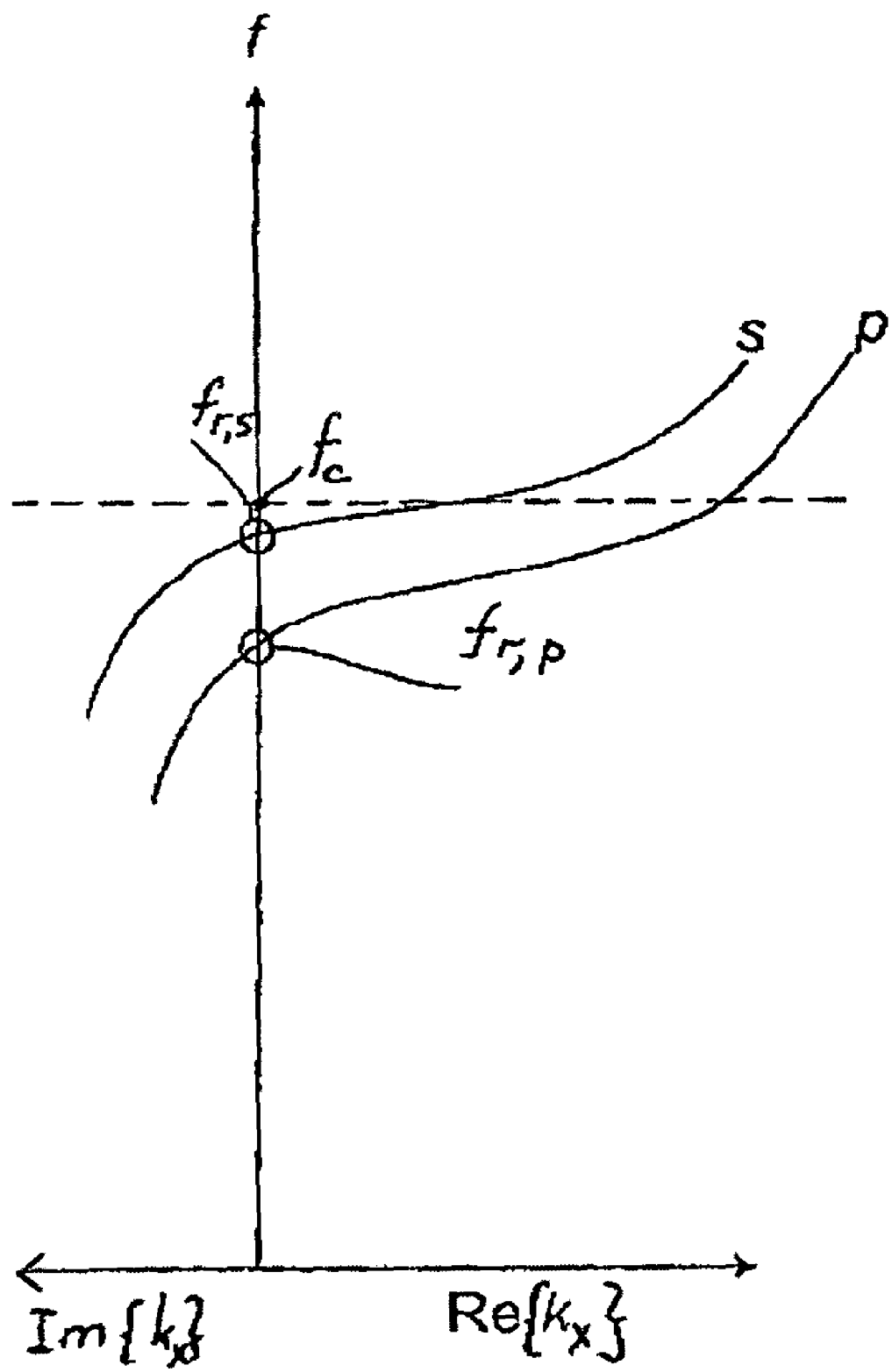
FIG. 3, the dispersion curves in the series resonator and in the parallel resonator with normal dispersion behavior.

FIG. 3 shows the dispersion curve s in the series resonator and the dispersion curve p in the parallel resonator, both resonators having normal dispersion behavior. At the frequency $f_c > f_{r,s}$, acoustic oscillations can propagate in both resonators.

Figure 4:
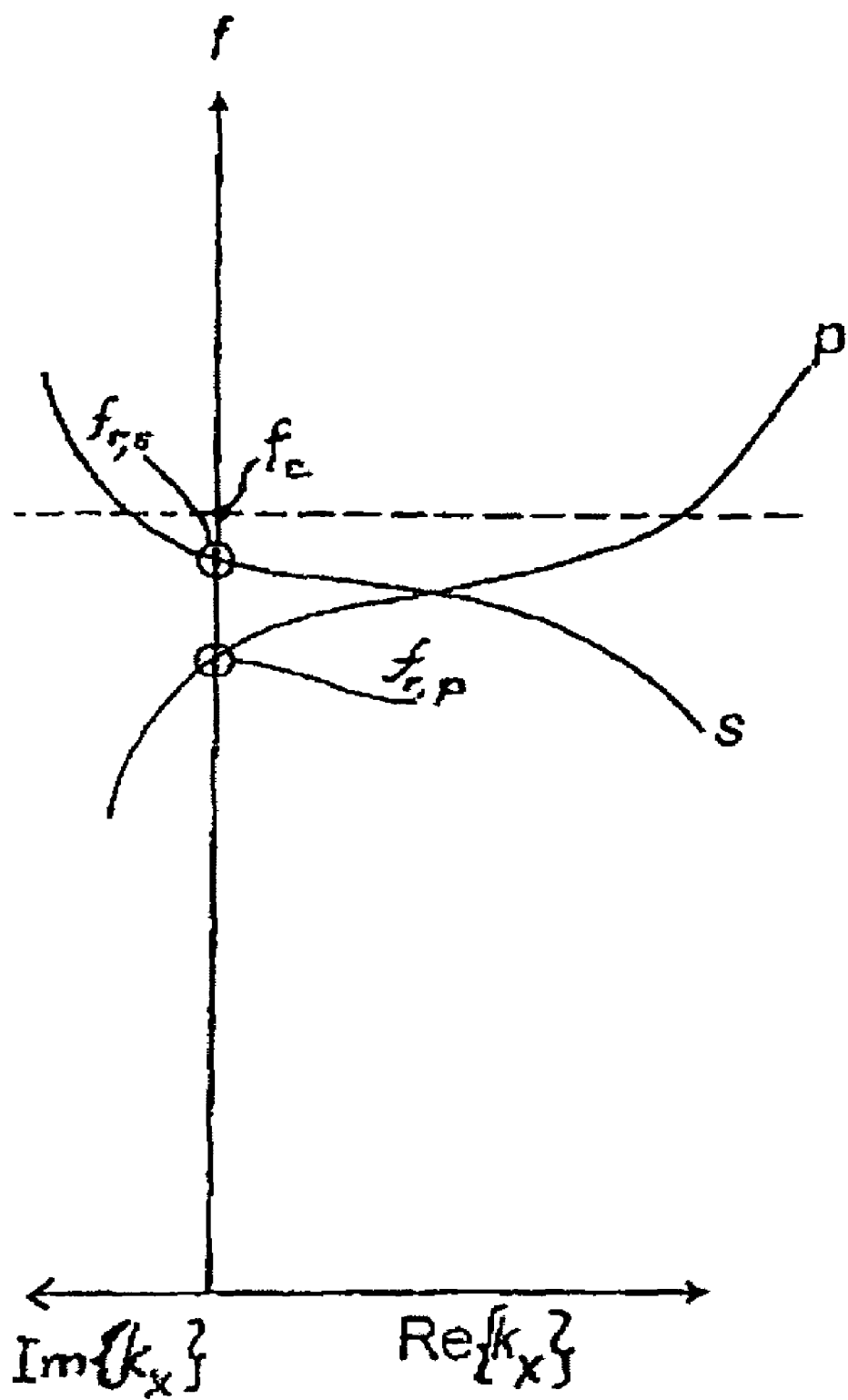
FIG. 4, the dispersion curves in the series resonator with abnormal dispersion behavior and in the parallel resonator with normal dispersion behavior.

FIG. 4 shows the dispersion curve s in the series resonator and the dispersion curve p in the parallel resonator, the series resonator having abnormal dispersion behavior with a negative slope for $k_x > 0$, and the parallel resonator having normal dispersion behavior with a positive slope for $k_x > 0$. At the frequency $f_c > f_{r,s}$, acoustic oscillations cannot propagate in the series resonator. Acoustic oscillations are capable of propagation in the parallel resonator at this frequency.

Depending on the variant, $f_c = f_{cL}$ (corresponds to the acoustic principal mode of a longitudinal wave) or $f_c = f_{cS}$ (principal mode corresponds to a shear wave).

Figure 5:
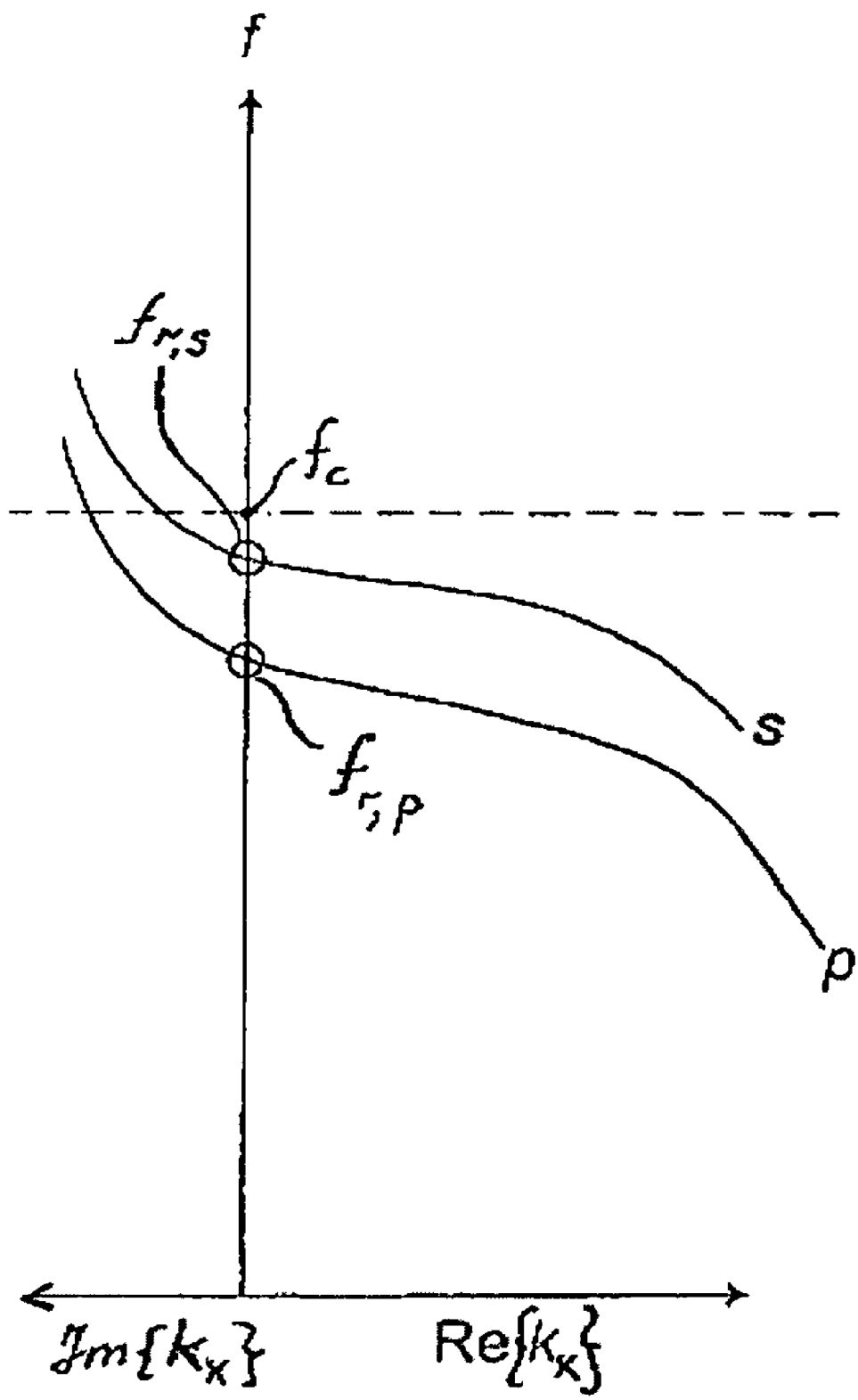
FIG. 5, the dispersion curves in the series resonator and in the parallel resonator with abnormal dispersion behavior.

FIG. 5 shows the dispersion curve s in the series resonator and the dispersion curve p in the parallel resonator with abnormal dispersion behavior. At the frequency $f_c > f_{r,s}$, no acoustic oscillations can propagate in the two resonators.

Figure 6:
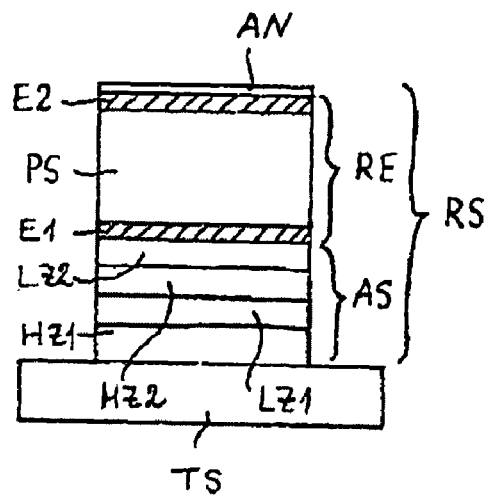
FIG. 6, the layer structure of a resonator stack with an acoustic mirror and an adapting layer in cross section.

FIG. 6 shows the structure of the resonator stack RS of the first or second resonator in a schematic cross section transverse to the surface of the layers. Resonator stack RS is arranged on a carrier substrate TS. Resonator stack RS has a first layer structure (the resonator region RE) and a second layer structure (the acoustic mirror AS).

Resonator region RE has a piezoelectric layer PS that is arranged between a lower electrode layer E1 and an upper electrode layer E2. Acoustic mirror AS has a first and second layer LZ1, LZ2 with a lower acoustic impedance, and a first and second layer HZ1, HZ2 with a higher acoustic impedance. The acoustic mirror can also have several layers with a low or high acoustic impedance. The layers with a high and a low acoustic impedance are arranged alternately.

An adapting layer AN, with which the frequency of the resonator can be shifted to lower frequencies, can additionally be furnished in resonator stack RS. Adapting layer AN is arranged on the upper electrode layer E2. It is possible with an adapting layer AN to convert the dispersion behavior of the resonator of a given dispersion type into another dispersion (e.g., from normal to abnormal dispersion or vice versa).

Resonator region RE forms an acoustic oscillator in which a longitudinal acoustic mode is capable of propagation. The resonant frequency and the dispersion behavior of the resonator (relative to the longitudinal acoustic mode) is dependent on the nature and the dimension of all layers of the respective resonator stack. The dispersion type of the resonator can be adjusted, for example, by the appropriate selection of materials and layer thicknesses in the construction of the acoustic mirror, as a function of the given configuration (material, layer thickness) of the electrode layers. In the resonator, abnormal dispersion is adjusted according to the invention by the selection of material and the relative thicknesses of layers HZ1, LZ1, HZ2, LZ2, E1, PS, E2, AN.

A layer structure as follows, for example, has normal dispersion. An Si substrate is used as carrier substrate TS. The acoustic mirror AS has from above to below in the indicated sequence, a 500-nm thick first W-layer HZ1, a 650-nm thick first $SiO_2$ layer LZ1, a 500-nm thick second W-layer HZ2, and a 650-nm thick second $SiO_2$ layer LZ2. A 250-nm thick lower electrode layer E1 of molybdenum is arranged on the second $SiO_2$ layer. Between lower electrode layer E1 and 250-nm thick upper electrode layer E2, a 1610-nm thick piezoelectric layer PS of AlN is arranged. The indicated layer structure is suitable for the first resonator. The resonant frequency of a resonator with the layer structure specified here is 1900 MHz.

If the thickness of layer LZ1 is 600 nm in this layer structure, and the thickness of layer LZ2 is adjusted to 500 nm and a 140-nm thick adapting layer AN of $SiO_2$ is arranged on upper electrode layer E2, the dispersion behavior at the same resonant frequency becomes abnormal. Such a layer structure is therefore suitable for the second resonator. The resonant frequency of the second resonator should preferably be adjusted to be higher than that of the first resonator by, for example, a lower thickness of adapting layer AN, electrode layers E1, E2 and/or at least one of the layers of the acoustic mirror.

Figure 7:
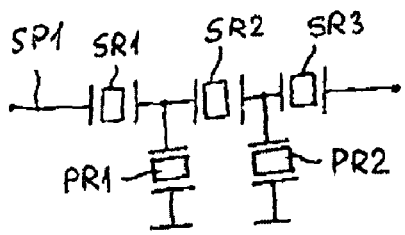
FIG. 7, a filter in a ladder-type construction.

A filter with a signal path SP1 and shunt arms connected to reference potential is shown in FIG. 7. Series resonators SR1-SR3 are arranged in signal path SP1. Parallel resonators are arranged in each of the shunt arms.

Figure 8:
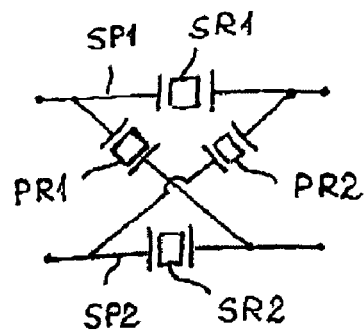
FIG. 8, a filter in a lattice-type construction.

FIG. 8 shows a filter with two signal paths SP1, SP2 and shunt arms connected between the signal paths. A series resonator SR1, SR2 is arranged in each signal path SP1, SP2, and a parallel resonator PR1, PR2 is arranged in each shunt arm.

The parallel resonators are each characterized by a resonant frequency $f_{r,p}$ and an antiresonant frequency $f_{a,p}$. The series resonators are characterized by a resonant frequency $f_{r,s}$ and an antiresonant frequency $f_{a,s}$.

All resonators in FIGS. 7, 8 are thin-film resonators with an acoustic mirror. All resonators in FIGS. 7, 8 have an abnormal acoustic dispersion of the longitudinal acoustic mode, i.e., the wave number $k_z$ of the longitudinal mode in the frequency range between the resonant frequency $f_{r,s}$ and the antiresonant frequency $f_{a,s}$ is imaginary.

Depending on their design, the parallel resonators have normal or abnormal dispersion. In all the parallel resonators arranged in the shunt arms, the wave number $k_z$ of the longitudinal mode in the frequency range between the resonant frequency $f_{r,p}$ and the antiresonant frequency $f_{a,p}$ is preferably imaginary.

The invention is not limited to the presented examples, certain materials, the type of filter and the number or special arrangement of the illustrated elements. In a resonator stack according to the invention, it is possible to attenuate lateral acoustic modes by special measures such as the structuring of the electrodes to differ from a rectangular shape. In the publication DE 102 41 425 A1, incorporated in full herein by reference, additional measures for suppressing lateral modes, as well as measures for influencing the dispersion curve f(k) in the resonator, are discussed.

Figure 9:
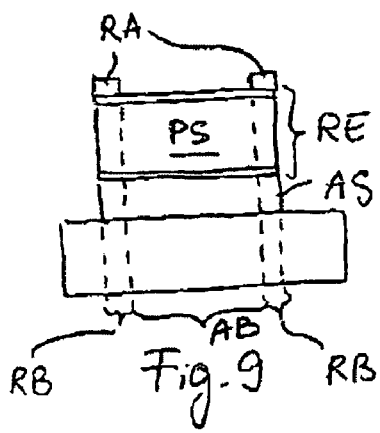
FIG. 9, the layer structure of a resonator stack that has a structure to attenuate lateral acoustic wave components.

FIG. 9 shows a layer structure of the resonator stack of a resonator that has normal dispersion behavior of the longitudinal acoustic mode. The resonator has an edge area RB, the projection of which onto a lateral plane is frame-shaped. Edge area RB surrounds an active region AB on all sides. A frame-shaped structure RA, which is suitable for attenuating lateral acoustic wave components, is arranged above edge area RB.

In the active region AB of this resonator, the lateral wave number $k_x$ of acoustic waves is equal to zero. The lateral wave number $k_x$ in edge area RB is substantially purely real, and outside the active region AB and the edge area RB it is substantially purely imaginary.

The invention claimed is:

1. A filter operating with bulk acoustic waves, comprising:
   at least one first resonator; and
   at least one second resonator electrically connected to the at least one first resonator,
   wherein the at least one first resonator and the at least one second resonator are configured to allow propagation of a longitudinal acoustic mode in the at least one first resonator and the at least one second resonator,
   wherein the at least one first resonator has a dispersion behavior curve $f(k_x)$ of a longitudinal acoustic mode with a positive slope for a lateral wave number $k_x > 0$ and the at least one second resonator has an $f(k_x)$ curve with a negative slope for $k_x > 0$.

2. The filter of claim 1, further comprising:
   a carrier substrate;
   wherein the at least one first resonator and the at least one second resonator each comprise a resonator stack that comprises a resonator region and an acoustic mirror between the resonator region and the carrier substrate.

3. The filter of claim 2,
   wherein the at least one second resonator comprises an adapting layer; and the resonator region is between the adapting layer and the acoustic mirror.

4. The filter of claim 3, wherein the at least one second resonator comprises at least one sublayer of W and/or Mo.

5. The filter of claim 2, wherein for at least one of the first and second resonators, the dispersion behavior of the resonator stack deviates from the dispersion behavior of the resonator region of the at least one of the first and second resonators.

6. The filter of claim 1, wherein the at least one first resonator is a parallel resonator.

7. The filter of claim 1, wherein the at least one second resonator is a series resonator.

8. The filter of claim 1,
wherein the filter comprises a ladder-type construction with a signal path and at least one shunt arm connected to reference potential, and the at least one second resonator is in the signal path and the at least one first resonator is in the at least one shunt arm.

9. The filter of claim 8, wherein all shunt arm resonators in the filter are constructed as first resonators and all signal path resonators in the filter are constructed as second resonators.

10. The filter of claim 1,
wherein the filter includes at least two second resonators arranged in first and second signal paths in a lattice-type construction comprising the first signal path and the second signal path and at least one shunt arm connecting the first and second signal paths, and
the at least one first resonator is in the at least one shunt arm.

11. The filter of claim 10, wherein all shunt arm resonators in the filter are constructed as first resonators and all signal path resonators in the filter are constructed as second resonators.

12. The filter of claim 1, wherein:
the at least one first resonator includes a plurality of parallel resonators;
the at least one second resonator includes a plurality of series resonators, and
each parallel resonator is characterized by a resonant frequency $f_{r,p}$ and an antiresonant frequency $f_{a,p}$,
each series resonator is characterized by a resonant frequency $f_{r,s}$ and an antiresonant frequency $f_{a,s}$,
a lateral wave number $k_x$ is real and in the frequency range between $f_{r,p}$ and $f_{a,p}$ for all parallel resonators,
a lateral wave number $k_x$ is imaginary and in the frequency range between $f_{r,s}$ and $f_{a,s}$ for all series resonators.

13. The filter of claim 1, further comprising:
a frame above an area of the at least one first resonator, the frame comprising an edge area surrounding an acoustically active region of the at least one first resonator on all sides,
wherein:
$k_x=0$ in the active region of the at least one first resonator, and
acoustic waves in the edge area have a substantially purely real lateral wave number $k_x$ and the lateral wave number $k_x$ outside the active region and edge area of the at least one first resonator is substantially purely imaginary.

* * * * *